(12) United States Patent
Schoenlinner et al.

(10) Patent No.: US 10,573,478 B2
(45) Date of Patent: Feb. 25, 2020

(54) ELECTRONIC COMPONENT

(71) Applicant: Airbus Defence and Space GmbH, Ottobrunn (DE)

(72) Inventors: Bernhard Schoenlinner, Munich (DE); Ulrich Prechtel, Munich (DE)

(73) Assignee: Airbus Defence and Space GmbH, Ottobrunn (DE)

( * ) Notice: Subject to any disclaimer, the term of this patent is extended or adjusted under 35 U.S.C. 154(b) by 34 days.

(21) Appl. No.: 15/151,798

(22) Filed: May 11, 2016

(65) Prior Publication Data

US 2016/0336134 A1    Nov. 17, 2016

(30) Foreign Application Priority Data

May 12, 2015   (EP) .................................... 15167271

(51) Int. Cl.
*H01H 59/00*    (2006.01)
(52) U.S. Cl.
CPC ................ *H01H 59/0009* (2013.01)
(58) Field of Classification Search
CPC ................... H01H 59/0009; B81B 7/007
USPC ............................................... 333/33
See application file for complete search history.

(56) References Cited

U.S. PATENT DOCUMENTS

| | | | |
|---|---|---|---|
| 6,369,324 B1* | 4/2002 | Tomie | H01L 23/66 174/541 |
| 6,384,353 B1 | 5/2002 | Huang et al. | |
| 2003/0030516 A1* | 2/2003 | Tsukiyama | H01L 23/66 333/247 |

FOREIGN PATENT DOCUMENTS

EP    0 637 871 A1    2/1995

* cited by examiner

*Primary Examiner* — Stephen E. Jones
*Assistant Examiner* — Samuel S Outten
(74) *Attorney, Agent, or Firm* — Crowell & Moring LLP

(57) ABSTRACT

The present disclosure relates to an electronic high-frequency component for accommodating micro-devices, having at least two housing parts which are joined together by a metal frame and which enclose a cavity, and at least one input signal line configured to introduce electrical high-frequency signals from outside of the component into the cavity. The input signal line is connected to a signal line via. Furthermore, the high-frequency component also has at least one short-circuit via which electrically connects the metal frame to at least one of the housing parts of the component.

12 Claims, 7 Drawing Sheets

ELECTRONIC COMPONENT

CROSS REFERENCE TO RELATED APPLICATION

This application claims priority under 35 U.S.C. § 119 from German Patent Application No. 15167271.4, filed May 12, 2015, the entire disclosure of which is herein expressly incorporated by reference.

FIELD OF THE INVENTION

The present patent application relates to an electronic component, in particular a component for use in the high-frequency range, which can preferably encapsulate one or more micro-devices that are hermetically sealed from an exterior environment, at the same time permitting input and output of high-frequency signals into and out of the interior of the component with as little interference as possible. These micro-devices are preferably microelectromechanical systems (MEMS), micro-optoelectromechanical systems (MOEMS) or the like.

BACKGROUND AND SUMMARY OF THE INVENTION

The known electronic components often have a hermetically sealed housing to ensure reliable functioning of the MEMS placed therein. The housing is usually made of two parts which consist of or were cut out of semiconductor wafers. At the locations where a cavity for placement of the MEMS is required, a recess is created in one or both parts of the housing by means of known etching methods, for example. The two housing parts can then be joined together permanently by known methods. Min and Rebeiz discuss such joining methods (Byung-Wook Min and Gabriel M. Rebeiz in IEEE Transactions on Microwave Theory and Technique, Vol. 54, No. 2, February 2006, pages 710ff.: "A Low-Loss Silicon-on-Silicon DC110 GHz Resonance-Free Package").

One possibility for joining the parts consists of using so-called "glass frit" bonding methods, but these methods must be carried out at high temperatures that can lead to thermally induced stresses and the like in the component. Therefore, metallic bond frames are often used. These are arranged peripherally around the desired cavity, for example, and are then "welded" together by means of a bonding technique. This does not require the use of very high temperatures such as those required in glass frit bonding. The metallic bond frames may also be designed to be narrower.

Furthermore, there is a technical requirement that electrical high-frequency signals be introduced into the interior of the housing, so that signal feedthroughs are required. In the case of high-frequency signals, the technical problem is that cross-talk with the signal can occur on the metallic bond frames and therefore the signal feedthrough deteriorates at certain frequencies, i.e., losses occur. This is true in particular when the signal line in the interior of the housing is implemented as a micro-strip line (MSL).

Known components have configurations and/or concepts with which the signal deteriorations due to parasitic couplings between the metallic bond frames and the feedthroughs and/or the lines running through the feedthrough are to be reduced. Thus, for example, Margomenos and Katehi as well as Yu and Liao describe concepts, in which the signal line runs inside and outside of the housing as a coplanar line and the lines are connected via a vertical feedthrough through three parallel vias (though-silicon vias, abbreviated: "TSVs") (Margomenos, A. and Katehi, L. P. B. at the 34th European Microwave Conference, Amsterdam, 2004, pages 645 ff.: "Ultra-wideband three-dimensional transitions for on-wafer packages" as well as Yu, W. and Liao, X. at the International Conference on Electronic Packaging Technology and High Density Packaging, IEEE, 2009, pages 201 ff.: "Design and simulation of a package solution for millimeter wave MEMS switch").

These configurations create less coupling with the bond frame, but an even greater need for reduction has already been described by Lim et al. (Lim, Y. Y. et al. at Transducers 2011, Beijing, June 2011, pages 406 ff.: "A broadband 3D package for RF MEMS devices utilizing through-silicon vias TSV"). Further reduction in unwanted signal deterioration should be achieved according to Lim et al. through additional free-standing TSVs in the cavity.

However, there is still parasitic coupling with this configuration, so there is still a demand for optimization of the signal deterioration.

Furthermore, the researchers Min and Rebeiz mentioned above have pursued another configuration, in which a lateral feedthrough is provided with a thin insulation layer from the bond frame. The negative effects of the relatively strong coupling thereby induced are suppressed by removing the thin insulation layer beyond the signal line and connecting the bond frame and ground of the coplanar line. However, this configuration is relatively complex from the standpoint of production of the component. In addition, a component having a lateral feedthrough can be integrated into a circuit board only with great effort. For good signal transmission from the circuit board to the component, it is necessary to create packets in the circuit board to hold the component and to bring the terminal contacts to the same level as the terminal contacts on the circuit board. The electrical connection is usually supplied by bond wires. However, creating the pockets in the circuit board and the electrical connection with the bond wires are relative complex and therefore also expensive procedures.

There is a demand for an electronic component for integration of micro-devices in a cavity in the component, wherein high-frequency signals can be introduced into the interior of the component and output out of the interior of the component by means of high-frequency signal lines without any deterioration of the signals due to parasitic coupling to the component or parts thereof. Furthermore, there is a demand for a component that can be manufactured less expensively.

According to one aspect of the disclosure, an electronic high-frequency component is described for accommodating micro-devices, comprising at least two housing components which may be connected to one another by means of a metal frame and may include a cavity as described here. The cavity may preferably be arranged inside the metal frame.

The high-frequency component ("component" in short) may thus have at least one input signal line and optionally also at least one output signal line. The input and output signal lines (if the latter is present) may each be connected to a signal line via. In the optional case when at least one input signal line and at least one output signal line are to provided, the respective signal line via (inside the cavity or inside the bond frame) may be arranged at a distance from one another and connected to one another at least by means of an internal signal line. The aforementioned connection of the two signal line vias does not rule out the possibility that for the case when the internal signal line is to be connected to a MEMS switch or the like, the internal line is interrupted electrically in certain switch states of the switch.

Furthermore, the component described here may have at least one short-circuit via, which can electrically connect the metal frame to one of the housing components (preferably to a metallic ground surface on the housing component) of the component.

The short-circuit via may preferably be arranged inside the metal frame and/or the cavity. Alternatively or additionally, the short-circuit via may also be arranged outside of the cavity and therefore not inside the metal frame. It is thus optionally also possible to arrange a short-circuit via outside of the metal frame. Furthermore, an electrical connection in the form of a line, which runs along the outside of the chip and thus connects the metal frame to a (large) ground (surface) on the outside, may optionally also be established. This electrical line can be manufactured by metallization of a side wall of a housing part, for example.

The metal frame may preferably be a metallic bond frame, which preferably has a rectangular, square or round cross section. The advantage of the metal frame was already explained above. Among other things it does not require high temperatures for joining the housing parts, as is the case with glass frit bonding methods, for example. The metal frame may preferably be provided between the preferably two housing parts (more than two housing parts are also possible). The cavity may be created, for example, by means of known etching methods in at least one of the housing parts. The housing parts may preferably be semiconductor wafers or parts thereof. Silicon wafers in particular wafers made of highly resistive silicon are especially preferred. Alternatively the housing parts may also be made of glass, quartz or a ceramic.

The via(s) is/are preferably electrically conductive and in particular are preferably made of metal.

The at least one micro-device may be a microelectromechanical or micro-optoelectro-mechanical system (MEMS/MOEMS) or a corresponding nano system. One example of a MEMS system would be a switch in a high-frequency signal line. It should be pointed out that the cavity according to a particularly preferred alternative may be provided only for the accommodation of the MEMS and in particular may then be designed to be much smaller than the bond frame.

The component described here thus has the technical advantage that production is relatively uncomplicated because among other things it is not necessary to produce signal feedthrough insulation, which would then have to be removed again from predetermined locations in another complicated procedure. Furthermore, the component can be integrated into a circuit board inexpensively. In addition, this yields the technical advantage that the cavity is shielded from the penetration of dirt, moisture and the like because of the permanent bonding of the housing parts and the metal frame, and at the same time a high-frequency signal can be introduced into the housing which is hermetically sealed by means of the metallic bond frame without any deterioration of the signal due to parasitic coupling of signal line and bond frame.

The technically advantageous suppression/minimization of signal deterioration in input and/or output of the signal is preferably achieved here as follows: an electromagnetic wave or a portion thereof transmitting the signal can couple into the metal frame in passing through the input line and/or output line. In other words, a portion of the electric power and/or the signal can jump into the metal frame and propagate there. The resulting signal loss is suppressed and/or reduced here by the fact that the electrical short circuit, created by the short-circuit via, between the housing part and/or ground and/or a metal surface arranged on the housing part on which the input and/or output lines are arranged, and the metal frame leads to reflection of the electromagnetic wave that is input. The reflection then leads to a mutual elimination with the input electromagnetic wave. The technical effect described here can also be described differently, so that the length of the resonator or the metal frame here is reduced by one-half or is at least shortened (depending on the placement of short-circuit via), so that the resonant frequency is doubled and/or increased accordingly and therefore is no longer in the signal spectrum.

Furthermore, according to additional preferred aspects, at least one short-circuit via may also be arranged at the side of the input and output signal lines (if the latter is present). The short-circuit via(s) may in particular be placed as close as possible to one side of the input and/or output signal lines. Preferably, a short-circuit via may be arranged on each side of the input and output signal lines (if the latter is present). This side-by-side arrangement has shown that destructive reflection can be created in the metal frame especially effectively, so that minimization of signal interference is particularly effective.

Preferably, for example, with one input signal line and one output signal line as well as two short-circuit vias arranged side by side (i.e., four), these four short-circuit vias may be placed inside the metal frame in order to achieve a particularly effective reduction of signal interference.

Preferred positions for the arrangement of a short-circuit via can be found at the middle of a side edge and/or the corner of a side edge of the component and/or of the metal frame, in particular when fundamental oscillations of the resonator are to be influenced.

According to an alternative or additional aspect, one (or more) short-circuit via(s) may be embodied by means of a metallized side wall of at least one of the two housing parts. This means in particular that a via can be established by metallization of one part or an entire side wall, wherein the metallized side wall and/or its metal layer then establishes the electrical short circuit between the frame and ground. The side wall may preferably be an exterior wall of the housing part and need not be completely metallized. As in the case of the short-circuit vias described above, an electrical short circuit between the metal frame and ground of the input and/or output signal lines is established by means of metallization and can thus greatly reduce or even prevent the signal interference described above. This embodiment has the technical advantage that it permits a design of the component that is optimized with regard to installation space.

According to other aspects, the internal signal line may be a coplanar line or preferably a micro-strip line which can connect a micro-device electrically to the input and output signal lines. The input and output lines may preferably be coplanar lines. These short-circuit via(s) may preferably connect an electrical ground of the input and output lines electrically to the metal frame. The electrical ground may be part of one of the housing parts or may be arranged thereon. Use of micro-strip lines (in comparison with coplanar lines) in combination with silicon housing parts has the advantage that there are little or no losses due to conductive boundary layers between the silicon and silicon oxide.

According to another aspect, the vias may be arranged vertically to the cavity, i.e., vertically to the housing parts arranged in parallel to one another. Thus a vertical feedthrough of a high-frequency signal into a hermetic housing by means of a metal bond frame is possible without any signal deterioration due to the coupling of the signal line and the bond frame. This permits a broadband signal feedthrough. Vertical feedthrough also has the technical advantage that no other insulation of the signal lines need be applied, such as that which would be necessary with a lateral feedthrough, for example, and would make production more complex. Integration of the component on a circuit board is also facilitated by the vertical arrangement. Thus, for example, the component can be integrated inexpensively onto the circuit board and with relatively little effort by using a soldering method, with the terminal contacts on one of the two large exterior surfaces like a regular SMD component (surface mount device component).

According to another aspect, one or more feedthroughs, in which the signal line via can be arranged, may be arranged inside the metal frame. Preferably, the feedthrough and/or signal line via may be arranged in a position in which there is a large difference (or preferably the maximum difference) between the surge impedance of the input or output signal line and that of the metal frame. This positioning of the feedthrough(s) permits a further substantial reduction in the signal interference because coupling of the signal wave into the metal frame is initially hindered and, additionally, the elimination of a wave, which can nevertheless be input, can be extinguished by means of the short-circuit vias.

According to another aspect, the component and/or the housing parts may have a rectangular, round or square shape to achieve the handiest possible shape. The metal frame may preferably be arranged on an outer edge of the component and/or the two housing parts, especially preferably being flush with same. Furthermore, the metal frame may have a width of a few micrometers up to several tens of micrometers to achieve the most secure possible seal, i.e., encapsulation of the cavity. Values between 50 µm and 300 µm are preferred, for example.

Furthermore, the signal line vias of electrically interconnected signal input lines and output lines may be arranged so that they are opposite one another (as seen across the cavity), so that the line(s) between the signal line vias may be designed to be as linear/straight as possible.

According to another aspect, the input and output signal lines may each be arranged on the same housing part as the internal signal line. Alternatively, the input and output signal lines may also be arranged on a first housing part, and the internal signal line may be arranged on the second housing part. Preferably, the signal line vias may connect the internal signal line electrically (vertically) to the input and output signal lines so that a vertical feedthrough of the high-frequency signal through the signal line vias is made possible.

In summary, an electronic component is presented here for handling of high-frequency signals, requiring less manufacturing effort and reducing signal deterioration on input and output of high-frequency signals into and out of the cavity of the component in the best possible way. Furthermore, the component can be integrated more easily into a circuit board in particular due to the arrangement of the signal line vias.

The electronic component presented here is described in detail below as an example with reference to the accompanying schematic drawings, in which:

DETAILED DESCRIPTION OF THE DRAWINGS

Figures 1A, 1B:
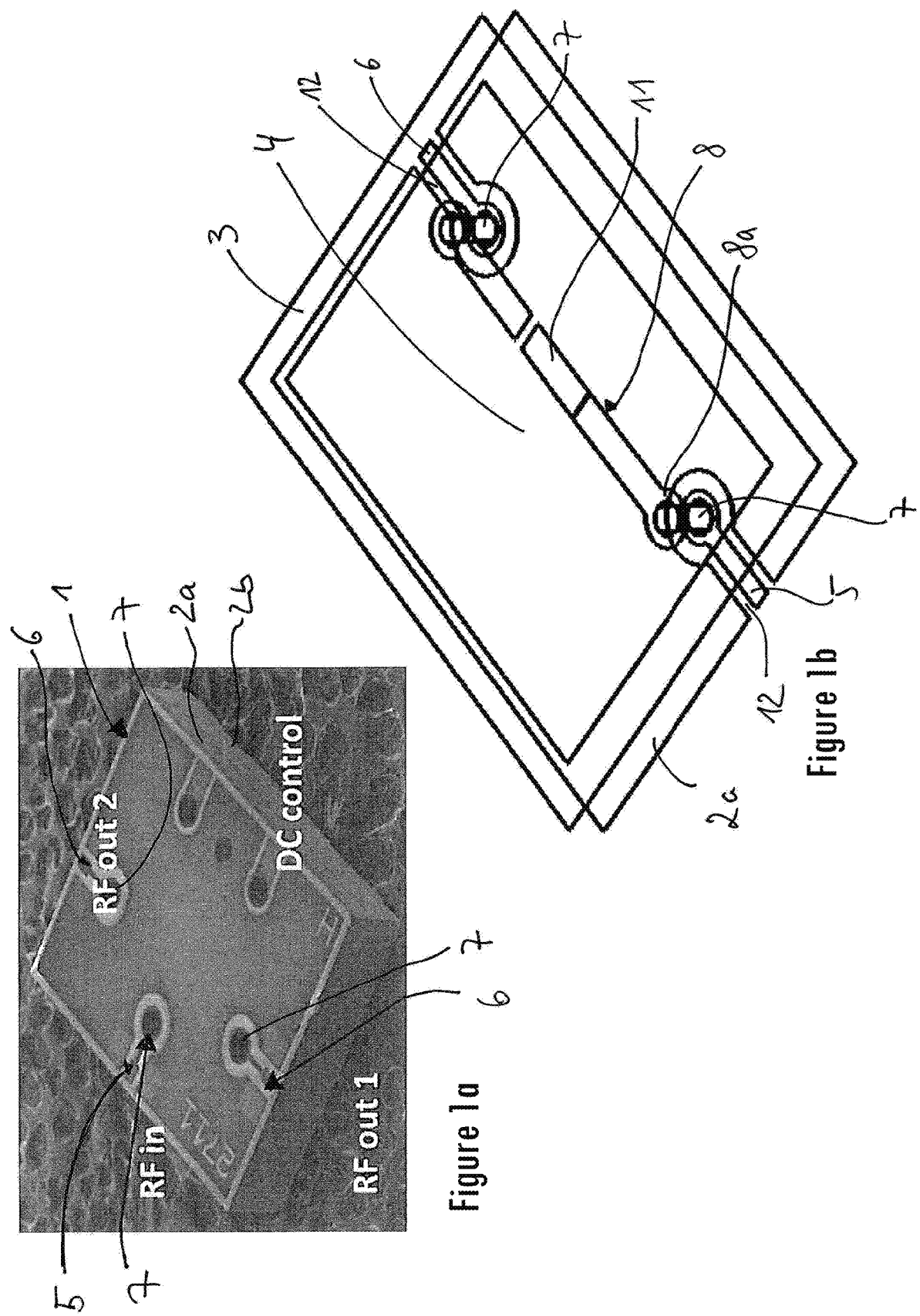
FIG. 1a shows a scanning electron micrograph of a known electronic high-frequency component.
FIG. 1b shows a reduced-detail schematic drawing of a high-frequency component.

Various examples are described in detail below with reference to the figures. The same and/or similar elements in the figures are designated with the same reference numerals. However the present device is not limited to the combinations of features described here. Instead other modifications and combinations of features of different examples should also be included in the scope of protection of the independent claims.

FIG. 1a shows a scanning electron micrograph of a known high-frequency component 1 having vertical high-frequency feedthroughs into a cavity 4 of the component 1. Specifically FIG. 1a shows that two silicon wafer housing parts 2a and 2b are placed flush one above the other and secured. On the top housing part 2a, coplanar lines are applied as input and output signal lines 5, 6 which are connected to vertical via vias, more specifically signal line vias 7. In FIG. 1a the component 1 has two outputs, labeled as "RF out ½" and one input, labeled as "RF in." Component 1 and/or its housing parts 2a, 2b have a conventional rectangular shape and also have contacts for control terminals on one side edge, one of which is labeled as "DC control."

The two housing parts 2a, 2b are joined by means of a metallic (bond) frame 3, which is not visible in FIG. 1a because it is arranged between the two housing parts 2a, 2b and has a height of only a few nanometers or at most micrometers.

FIG. 1b shows a simplified schematic drawing of one example of a component 1, which is described here (for the sake of simplicity, shown without any short-circuit vias in FIG. 1b), in which the metal frame 3 is indicated by two parallel lines forming a rectangle. The body of component 1 is rotated in comparison with the diagram of the known component according to FIG. 1a, so that the first housing part 2a now points downward and the second housing part 2b points upward, although this is not shown. The first housing part 2a is shown in simplified terms only as a rectangular area comprising accommodating areas 12 for the line guidance of the input signal line 5 and of the output signal line 6. These lines 5, 6 each run towards vertical signal line vias 7 which are arranged inside the metal frame 3 as shown in FIG. 1b.

FIG. 1b also shows that an electric contact with another internal line 8 and/or its contact point 8a is also established at the other end in the vertical direction along the longitudinal axis of the signal line via 7, which is also referred to as a TSV or a through silicon via. The signal line via 7 or TSV is usually made of metal and is introduced within a feedthrough. The arrangement of the output and input signal lines 5, 6 as well as the signal line vias 7 is shown in the example according to FIG. 1b already in deviation from the known component 1 according to FIG. 1a. The technical background of this is that the signal line vias 7 and/or their feedthroughs 10 are already arranged in such a way for this embodiment as an example that the characteristic or surge impedance of the output and/input signal lines 5, 6 and of the metal frame 3 on this are as dissimilar as possible. More specifically, a position at approximately ¾ of the side edge length of the component was selected for FIG. 1b; this is a preferred position with respect to a first harmonic of the resonator in the metal frame 3 for suppressing an input/coupling into the metal frame 3. The position shown here should be regarded however as strictly an example and is not restrictive in any way because a specific position should be selected accordingly for the component described here in accordance with which oscillations (e.g., fundamental mode, first harmonic, etc.) are to be influenced and where the difference in the surge impedance between the metal frame 3 and that of the input and output signal lines 5, 6 should be as great as possible in view of this. This point will be considered again in greater detail below.

Furthermore, FIG. 1b shows an internal line or signal line 8 which connects the output and input signal lines 5, 6 to a micro-device 11, for example, a MEMS.

One technical disadvantage of the component 1 described in conjunction with FIG. 1a is in particular the fact that signals introduced into the cavity 4 of the component 1 can couple into the metal frame 3 which has a closed configuration, and thus can lead to a signal deterioration. In other words, the high-frequency signal coupled to the metal frame 3 so that unwanted resonances occur and may be manifested as dips in the transmission function. This is illustrated in FIG. 6.

Figure 6:
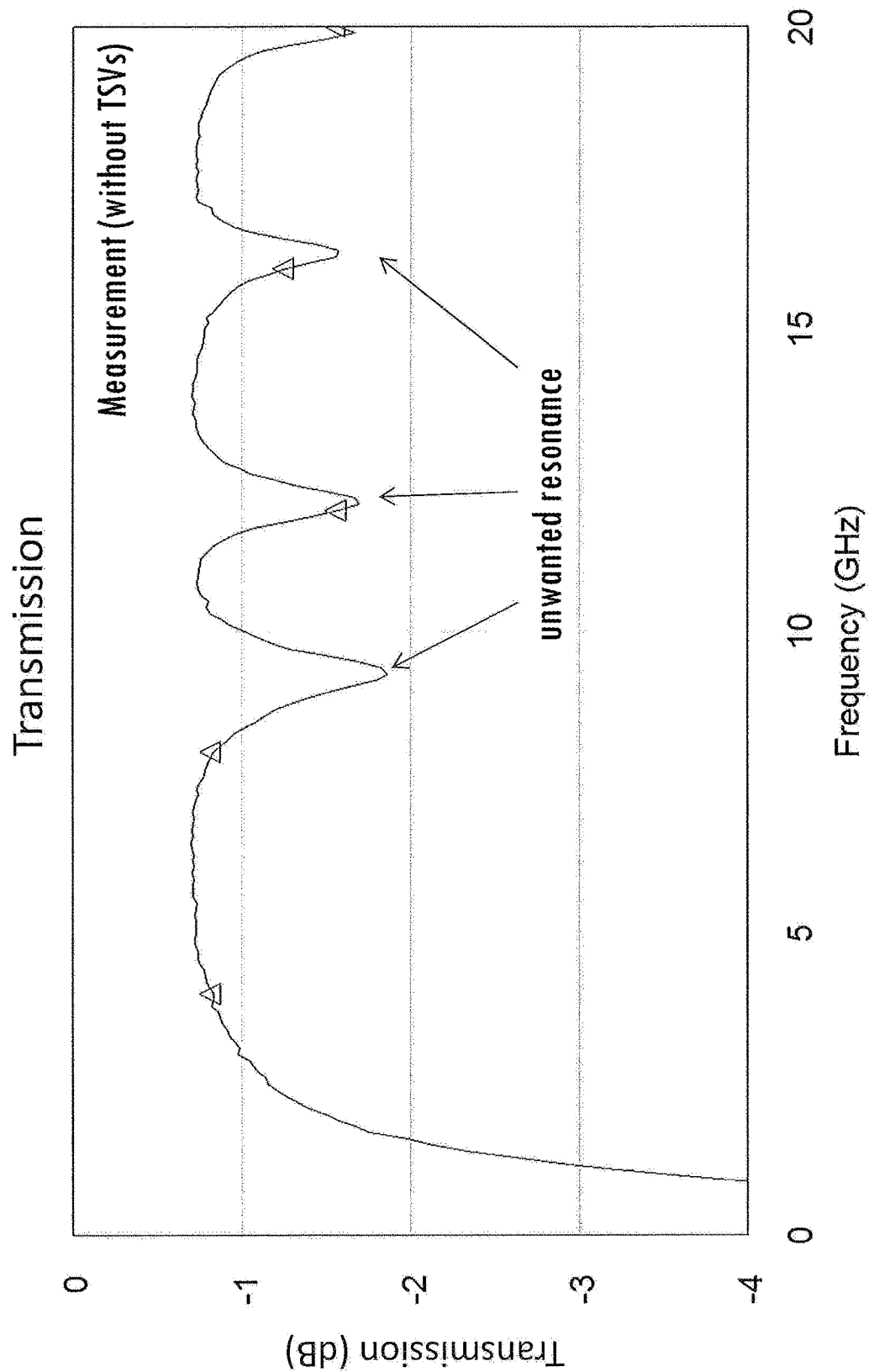
FIG. 6 shows a diagram of measurement results of transmission of a known high-frequency component with losses due to unwanted coupling effects.

In detail FIG. 6 shows on the ordinate the dB number of the transmission, i.e., the signal strength transmitted. This is shown over a frequency spectrum from 0 to 20 GHz, namely for a measurement (triangular marks) on a known component which in particular has no short-circuit vias. The simulated behavior of the part and in particular the resonant effects, i.e., signal dips are clearly visible in FIG. 6 and are marked separately by means of arrows, for example, in a few cases.

The loss of signal discussed above is unwanted technically and therefore should be reduced as much as possible. This is achieved with the device described here and/or the electronic high-frequency component which is shown in preferred embodiments in FIGS. 2-5. This diagram is the same as that in FIG. 1b, i.e., essentially the housing part 2a is shown only schematically by means of a rectangular area and the housing part 2b is removed or only the parts arranged on it are shown such as the contact surface 8a of the internal signal line 8. The metal frame 3 is shown as a continuous rectangle made up of two lines running parallel to one another. The vias 7, 9 are shown as three-dimensional objects.

Before the embodiments according to FIGS. 2 to 5 are explained in greater detail, it should first be pointed out that there is already a technical difference between the components 1 of FIGS. 1b and 2 to 5 and the known component 1 according to FIG. 1a. Thus, for example, the feedthroughs 10 for the vias of FIGS. 1b and 2 to 5 are arranged in such a way that the surge impedances of the input and output signal lines 5, 6 and of the frame 3 do not fit together in order to prevent coupling into the frame 3. Merely as an example, positioning at approximately ¾ of the side edge length of the component 1 has been selected in the figures; this is a preferred position with regard to the first harmonic of the resonator of the metal frame 3. Other examples of the positioning, for example, with respect to the fundamental modes, include placement in a corner or at the center of a side edge. The technical background for this can be explained as follows: A typical resonator is limited at its ends either by a short circuit or an open line. Both variants cause a complete reflection of the guided electromagnetic wave so that the wave is continuously "bounced back and forth" in the resonator. The short circuit is a location with a very low surge impedance e.g. 0 ohm, and the open line has a very high surge impedance. All possible surge impedances occur between the two ends of a resonator and there is at least one location with a very high surge impedance and at least one location with a very low surge impedance. Since the micro-strip line (or coplanar line) in the component 1 and/or chip has a surge impedance of 50 ohm, for example, locations on the metal frame 3 where there is very little signal cross-talk are locations either with a very low surge impedance or with a very high surge impedance but not with a surge impedance of approximately 50 ohm.

In FIG. 1b, the corners can be considered approximately as open lines, so that a resonator is formed on the shorter sides of the metal frame 3 between the corners, having a very high surge impedance at the corners and a very low surge impedance at the center. Consequently preferred locations for the feedthrough in FIG. 1b would be the center between two corners or very close to the corners, in particular when the fundamental modes of the resonator are addressed.

Since a resonator has not only a "fundamental mode" but also has higher order oscillations (or harmonics/harmonic components) so the preferred positionings (i.e., the locations where the surge impedances are as far apart as possible) may be located at locations other than the centers of the side edges or corners for modification of the higher order oscillations. Thus, FIG. 1b and the additional FIGS. 2 to 5, for example, show preferred positioning at ¾ of the side edge length. This is particularly advantageous with respect to the first harmonic.

Figure 2:
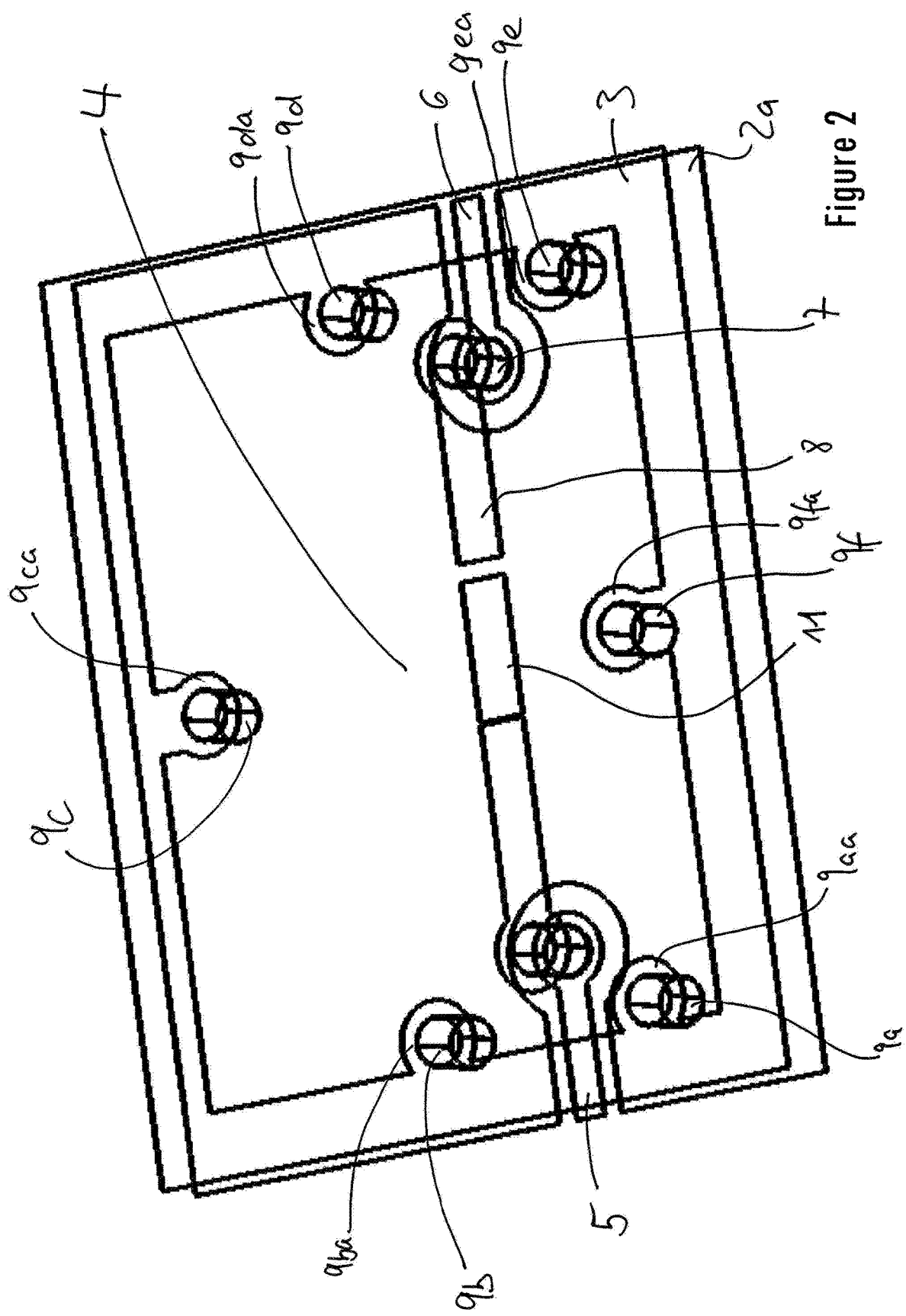
FIG. 2 shows a reduced-detail schematic drawing of a high-frequency component.

In addition, it should be noted that the resonator described here in FIG. 1b can be modified by additional short-circuit vias, e.g., 9c and 9f in FIG. 2 so that the dominant resonator may also be limited by these two vias.

Another technical difference in comparison with the embodiments according to FIGS. 2 to 5 is also the fact that these embodiments have additional vias 7, 9 but they do not serve the signal line in the actual sense but instead are provided as short-circuit vias 9a-f. These establish an electrical short circuit between the metal frame 3 and the ground of the input and/or output signal lines 5, 6. Ground is not shown in FIG. 1b (but is in FIG. 5). It sits on (or is integrated into) the housing part 2a which carries the input and output signal lines 5, 6. The electric short circuit has the advantageous technical effect that an electromagnetic wave input into the metal frame 3 is also extinguished again immediately by a reflection. Or, in other words, the placement of the at least one short-circuit via 9 causes the effective frame length to be shortened or cut in half, so that the natural frequencies are increased or doubled. An optimal reduction in signal deterioration is thus achieved so that a high frequency signal can be transmitted from the input signal line to the output signal line with the least possible interference.

FIGS. 2 through 5 show various views of an embodiment having six short-circuit contacts or vias 9a-f. The additional components of component 1 are comparable to those in the embodiment shown in FIG. 1*b*. In addition it should be pointed out that the embodiment provides coplanar lines for the input and output signal lines 5, 6 and a micro-strip line for the internal signal line 8. Also, although the figures show only one input and output signal line 5, 6 and one internal signal line 8, it should be pointed out that additional lines may be provided. Furthermore, as in the example of FIG. 1*a*, a plurality of output lines 6 may also be provided for an input signal line 5 or vice-versa. Furthermore, a plurality of input and output lines may also be provided.

Figure 3:
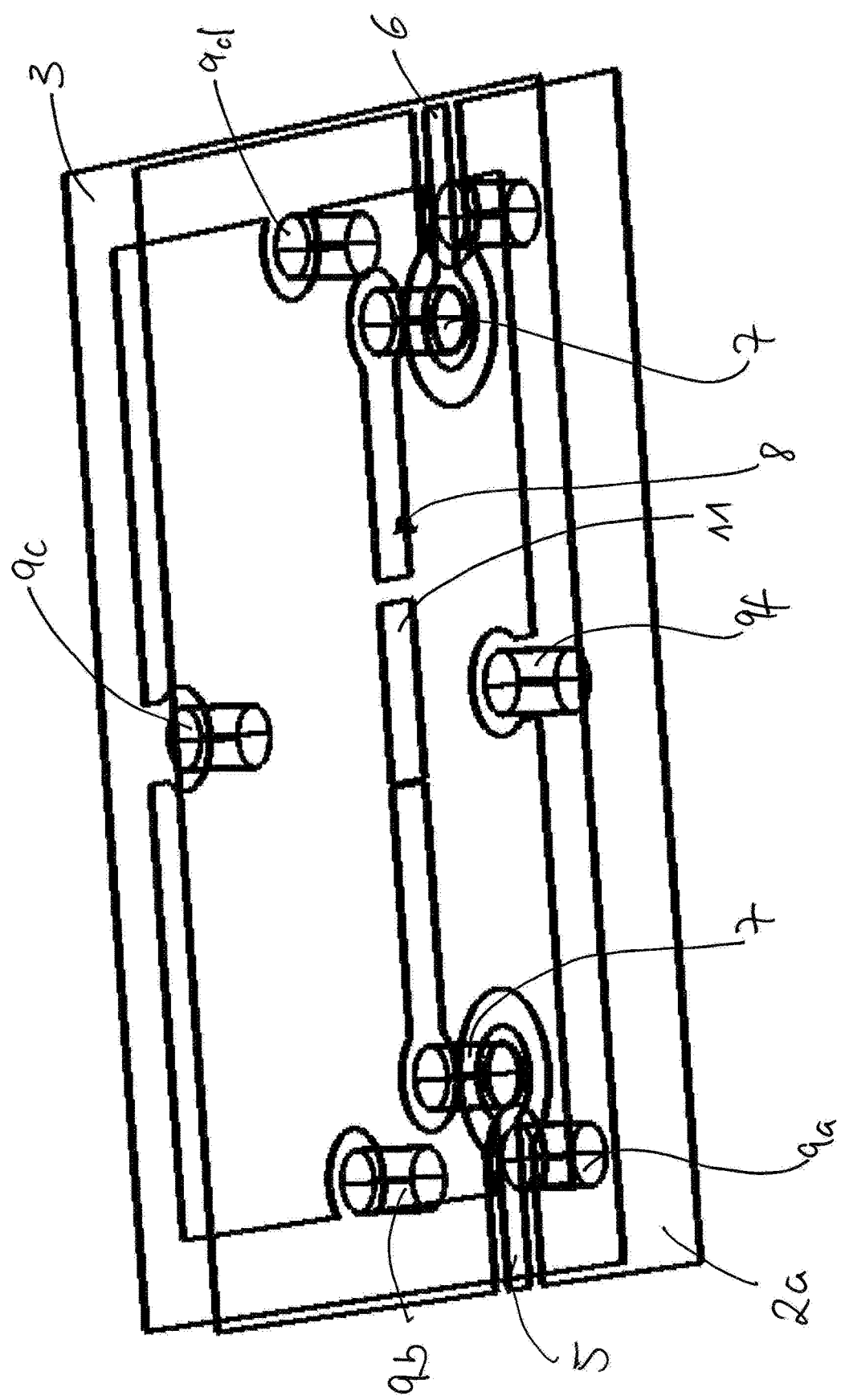
FIG. 3 shows a reduced-detail schematic drawing of a high-frequency component.
Figure 4:
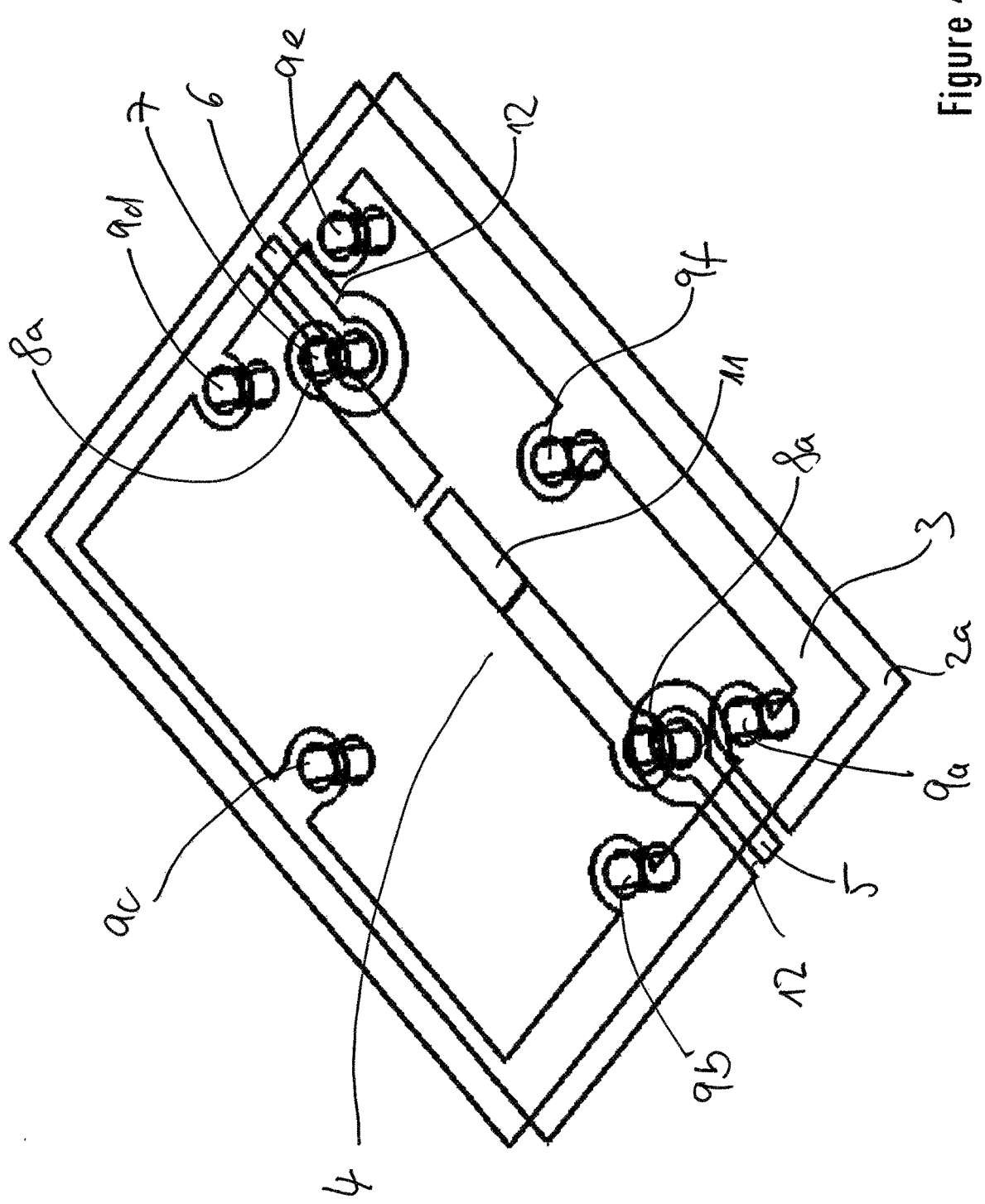
FIG. 4 shows a reduced-detail schematic drawing of a high-frequency component as described here.

FIGS. 2 through 4 show views of a schematic diagram of the component 1 with different angles of view in which a short-circuit via 9*a*, 9*b*, 9*d*, 9*e* is provided on each side of the input and output signal lines 5, 6. Preferred positions for the arrangement of the short-circuit vias 9 may be the corners or the centers of the side edges for each. This is illustrated particularly well in FIG. 2. Thus, a short-circuit via 9*a*, 9*e* is provided on one side of each input and output signal line 5, 6 respective in the corresponding corner of the component 4. Furthermore, another short-circuit via 9*b*, 9*d* is provided centrally on the shorter side edges of the component 1 and on the other side of the input and output signal lines 5, 6 respectively. This "framing" of the input and output signal lines 5, 6 has proven to be particularly effective in suppressing negative effects on the signal and therefore this arrangement is preferred.

However, a very good signal transmission without any major interference has already been achieved by using only one of the four short-circuit vias 9. Thus, embodiments having a only one short-circuit via 9 or having two, three or more are also conceivable.

An even greater reduction was achieved by adding at least one of the two additional short-circuit vias 9*c*, 9*f*, or even both. These are each arranged centrally on the longer side edge of component 1 and apart from and/or remotely from the input and output signal lines. The technical effect of adding additional short-circuit vias 9 can be explained by the fact that among other things the effective length of the frame 3 is further reduced so that the natural frequencies are increased even further.

In addition, FIGS. 2 through 4 also show another preferred and technically advantageous embodiment in comparison with the known configurations, and namely the signal line vias 7 are placed so close together that the surge impedances of the input and output signal lines 5, 6 and of the frame 3 do not correspond, to suppress coupling as much as possible (as discussed above, for example, positioning was selected here that would address the first harmonic).

In addition, FIG. 2 through 4 also show that the short-circuit vias 9 are contacted electrically to the metal frame 3 by means of electrical contact faces 9*aa*-9*fa*. This contacting, together with the contacting between the housing part 2*a* and/or the ground of signal lines 5, 6, creates an electrical short circuit, which entails the positive technical effect discussed above. In addition a feedthrough 10 is indicated in housing part 2*a*, through which the signal line via 7 runs.

Figure 5:
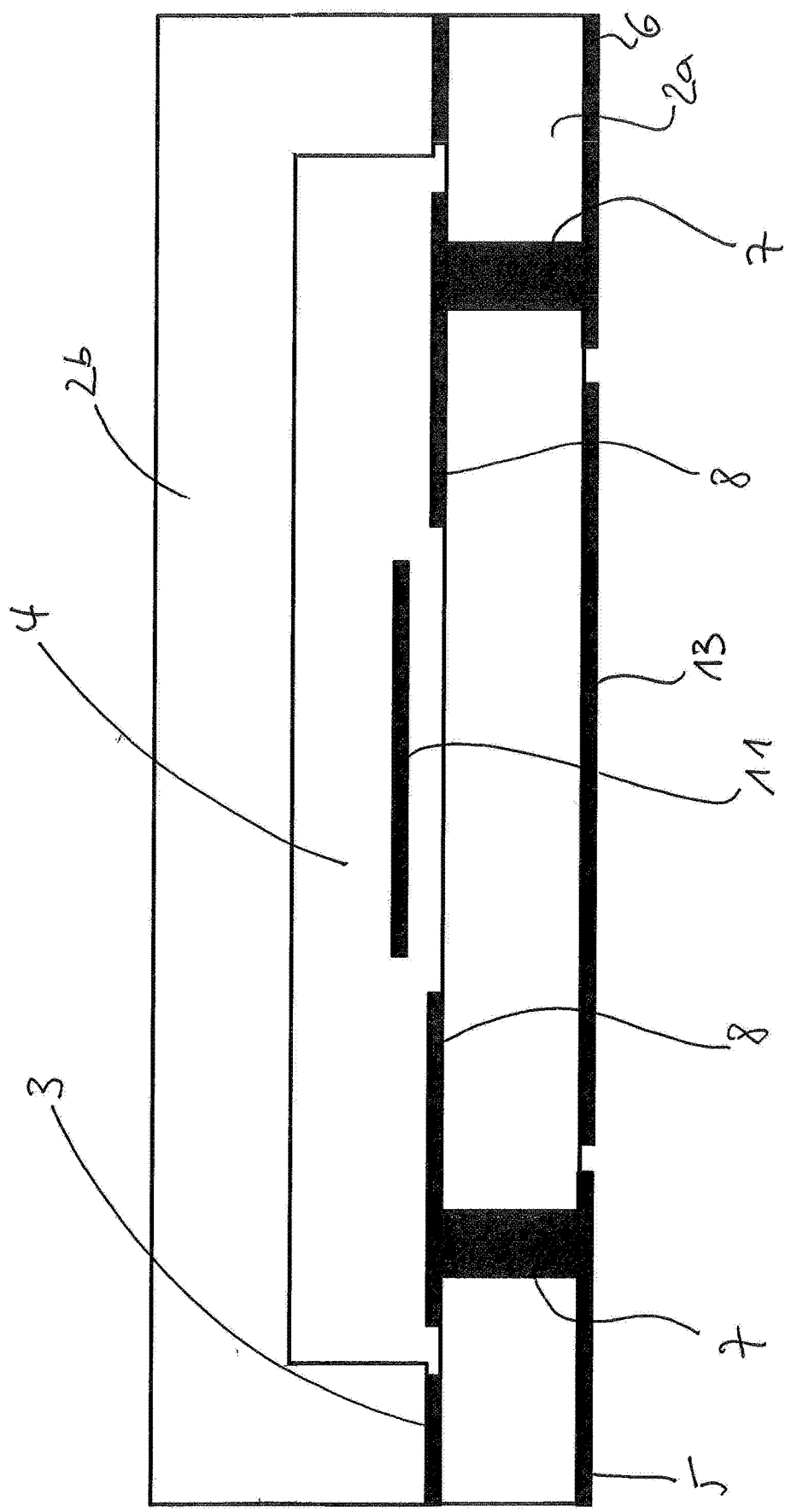
FIG. 5 shows a reduced-detail schematic drawing of a high-frequency component as described here.

Furthermore, FIG. 5 shows a schematic and simplified exemplary sectional view of component 1, which is described here, wherein the arrangement of the input and output signal lines 5, 6 on a surface of a first housing part 2*a* can be seen, as well as the arrangement of the internal signal line 8 on the same housing part 2*a*. The two lines are connected electrically by the signal line vias 7. The sectional view shows a presumed interruption in the electrical connection between the internal line 8 and the MEMS 11, but this is just a graphical effect due to the choice of the plane of intersection. Between the internal line 8 and MEMS 11, there is an electrical connection (this is also the case for FIGS. 2 through 4 in which a presumed interruption also appears to be detectable). The cavity 4 is then formed by affixing the second housing part 2*b* to the first housing part by means of the metal frame 3. The short-circuit vias 9 according to the views in FIGS. 2 through 4 are not visible in the sectional view. The electrical ground or a portion thereof, which is connected to at least one short-circuit via 9, is represented as a thick bar between input signal line 5 and output signal line 6 on the surface of housing part 2*a* in the sectional view in FIG. 5 and is labeled with reference numeral 13.

Alternatively or in addition to the short-circuit vias 9 according to the diagram in FIGS. 2 to 4, parts (or the entire area) of the side walls (e.g., an exterior side wall) of the first housing part 2*a* here may also be metallized, namely in such a way that the electrical short circuit between the electrical frame 3 and the ground of the input and/or output signal lines 5, 6 is established.

Preferably at least one micro-device, e.g., in the form of a MEMS or the like is inserted into the cavity 4. For example, a MEMS switch, which is to be used within a high-frequency line, is used here in particular. The micro-device is stored securely with respect to external influences, such as moisture or contaminants, because of the hermetic encapsulation between the two housing parts 2*a*, 2*b* permanently installed together, so that they are connected to one another.

Figure 7:
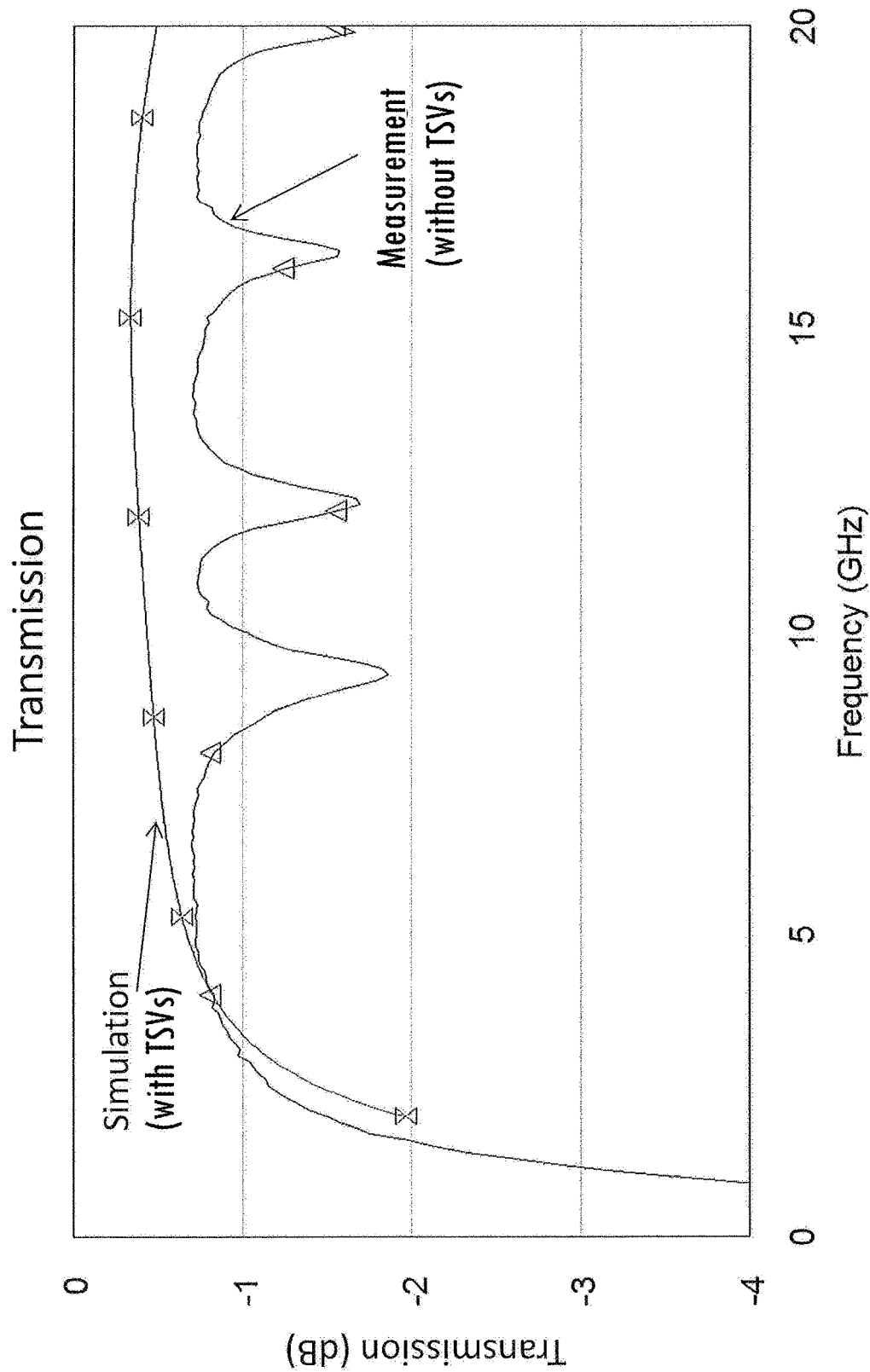
FIG. 7 shows a diagram of measurement results of transmission of a known high-frequency component with losses due to unwanted coupling effects (see also FIG. 6) and simulation results of transmission of a high-frequency component without losses due to unwanted coupling effects.

As already explained for FIG. 6, FIG. 7 shows a transmission function for a simulation of component 1 described here with short-circuit via 9 (hourglass markings) and for comparison purposes, the measurement results (triangular marks) again from FIG. 6. In comparison with the results according to FIG. 6 (known components) and the simulation result according to FIG. 7 (component described here), a definite improvement can be observed without any detectable signal interruptions.

In conclusion, it can thus be summarized that an electronic high-frequency component is described here, which has been further improved with regard to the ability to transmit a high-frequency signal with the least possible interference in comparison with known components and can also be fabricated with little effort and integrated into a circuit board.

What is claimed is:

1. An electronic high-frequency component for accommodating micro-devices, comprising:
   at least two housing parts joined together at a join by a metal frame so as to enclose a cavity, wherein the high-frequency component has at least one short-circuit via electrically connecting the metal frame to a ground of the high-frequency component opposite the metal frame, wherein the metal frame does not extend interior to the cavity beyond the join, except at one or more distinct electrical contact faces, each extending into the cavity beyond the join at exactly one side thereof, and wherein each of the at least one short-circuit via is electrically connected to the metal frame by a respective electrical contact face; and
   at least one input signal line and one output signal line for inputting and outputting of electrical high-frequency signals into and out of the cavity, wherein the input and output signal lines are each connected to one signal line via, respectively, and wherein the signal line vias are arranged with a distance between them and are connected to one another by means of at least one internal signal line, wherein a short-circuit via is arranged on each side of the input and output signal lines, wherein at least one of the short-circuit vias is embodied with a metallized side wall of at least one of the at least two housing parts, and wherein the metallized side wall is an exterior wall of the at least one of the at least two housing parts.

2. The electronic high-frequency component according to claim 1, wherein the input and output signal lines are coplanar lines.

3. The electronic high-frequency component according to claim 1, wherein the short-circuit via connects an electrical ground of a coplanar line electrically to the metal frame.

4. The electronic high-frequency component according to claim 1, wherein the short-circuit via is arranged at the center of a side edge and/or at the corner of a side edge of the metal frame.

5. The electronic high-frequency component according to claim 1, wherein the vias are arranged vertically with respect to the cavity.

6. The electronic high-frequency component according to claim 1, wherein a feedthrough, in which the signal line via is arranged, is itself arranged inside the metal frame, and this is at a location, such that there is a maximum difference between the surge impedance of the input or output signal line and the surge input impedance of the metal frame.

7. The electronic high-frequency component according to claim 1, wherein the component and/or the housing parts have a rectangular or square shape.

8. The electronic high-frequency component according to claim 1, wherein the signal line vias of electrically interconnected signal input and output signal lines are arranged opposite one another.

9. The electronic high-frequency component according to claim 1, wherein the internal signal line is a micro-strip line, which is able to connect a micro-device electrically to the input and output signal lines.

10. The electronic high-frequency component according to claim 1, wherein the input and output signal lines and the internal signal line are arranged on a same housing part.

11. The electronic high-frequency component according to claim 1, wherein the signal line vias electrically connect the internal signal line to the input and output signal lines.

12. The electronic high-frequency component according to claim 1, wherein at least one micro-device is a micro-electromechanical system.

* * * * *